United States Patent [19]

Obara

[11] Patent Number: 5,523,594
[45] Date of Patent: Jun. 4, 1996

[54] HETEROJUNCTION BIPOLAR TRANSISTOR

[75] Inventor: Masao Obara, Machida, Japan

[73] Assignee: Kabushiki Kaisha Toshiba, Kawasaki, Japan

[21] Appl. No.: 464,464

[22] Filed: Jun. 5, 1995

Related U.S. Application Data

[63] Continuation of Ser. No. 953,277, Sep. 30, 1992, abandoned, which is a continuation of Ser. No. 616,064, Nov. 20, 1990, abandoned.

[30] Foreign Application Priority Data

Nov. 24, 1989 [JP] Japan ..................... 1-306164
Mar. 30, 1990 [JP] Japan ..................... 2-84375

[51] Int. Cl.$^6$ .................... H01L 31/0328; H01L 31/0336
[52] U.S. Cl. ........................................... 257/197; 257/198
[58] Field of Search ................... 357/34, 35, 16, 357/37, 34 HB; 25/197, 198, 592, 591

[56] References Cited

U.S. PATENT DOCUMENTS

| | | | |
|---|---|---|---|
| 4,739,379 | 4/1988 | Akagi et al. | 257/197 |
| 4,794,440 | 12/1988 | Capasso et al. | 357/34 |
| 4,929,997 | 5/1990 | Honjo et al. | 357/34 |
| 4,933,732 | 6/1990 | Katoh et al. | 257/197 |
| 4,958,208 | 9/1990 | Tanaka | 257/197 |
| 4,967,254 | 10/1990 | Shimura | 257/197 |
| 4,979,009 | 12/1990 | Kusano et al. | 257/197 |
| 5,124,270 | 6/1992 | Morizuka | 257/197 |

OTHER PUBLICATIONS

H. C. Casey, Jr. et al., "Concentration–dependent absorption and spontaneous emission of heavily doped GaAs", Journal of Applied Physics, vol. 47, No. 2, Feb. 1976, pp. 631–643.
H. Kroemer, "Heterostructure Bipolar Transistors and Integrated Circuits", Proceedings of the IEEE, vol. 70, No. 1, Jan. 1982, pp. 13–25.
P. Bhattacharya, "The relationship of the D–X center in $Al_xGa_{1-x}As$ and other III–V alloys with the conduction band structure", Semicond. Sci. Technol. 3, 1988, pp. 1145–1156.
N. H. Sheng et al., "High Power GaAlAs/GaAs HBT's for Microwave Applications", The Proceedings of the IEDM, 1987, pp. 619–622.
Hayes et al; "Hot electron transport in a graded band–gap base HBT"; Aug. 8, 1988; pp. 490–492; Applied physics letters. 53.

Primary Examiner—Wael M. Fahmy
Attorney, Agent, or Firm—Finnegan, Henderson, Farabow, Garrett & Dunner

[57] ABSTRACT

An AlGaAs/GaAs heterojunction bipolar transistor in which a base doping concentration is set to be as very high as $5 \times 10^{19} cm^{-3}$ or more to cause a band gap narrowing effect and to reduce a band gap difference by an amount corresponding to the band gap narrowing effect, an Al composition ratio, i.e., x in an $Al_xGa_{1-x}As$ material of an emitter layer is set to be less than 0.25, whereby an emitter resistance can be made small, an operating speed can be made fast and a current gain can be made high. Preferably, the base doping concentration is set to be $1.2 \times 10^{20} cm^{-3}$ or more so that the operation speed can be made remarkably fast.

9 Claims, 2 Drawing Sheets

HETEROJUNCTION BIPOLAR TRANSISTOR

This application is a continuation of pending prior application Ser. No. 07/953,277 filed Sep. 30, 1992, now abandoned, which is a continuation of prior application Ser. No. 07/616,064 filed Nov. 20, 1990, now abandoned.

BACKGROUND OF THE INVENTION

1. Field of the Invention

The present invention relates to heterojunction bipolar transistors and more particularly, to a heterojunction bipolar transistor which is based on a heterojunction of AlGaAs/GaAs interface.

2. Description of the Related Art

Heterojunction bipolar transistors (HBTs), which are excellent in high frequency characteristics and switching characteristics, have been considered to be promising prospects as microwave transistors and high speed logical circuit transistors.

HBTs using GaAs, in particular, have been developed recently as superhigh speed devices which have a prospective future.

A major feature of the HBTs is that, since an emitter/base junction is a heterojunction, the impurity concentration of a base region can be made very high and a base resistance can be made low while preventing high impurity concentration of an emitter.

There have been recently proposed various types of structures of HBTs on the basis of the mobility characteristic of electrons in the GaAs, which can remarkably reduce a transit time of the electrons.

However, it is impossible to fully control the AlGaAs even with resorting to the use of the molecular-beam epitaxy (MBE) technique and this method involves various problems especially when an Al mole fraction exceeds 0.3.

When the Al mole fraction exceeds 0.3, the mobility of minority carriers becomes small and also DX centers decrease free carrier concentration significantly, which become serious obstacles to lowering the emitter resistance of the HBT.

Over the years, many studies have been made for making the operational speed of the HBT faster based on the scaling of ECL gates.

For the purpose of increasing the cut-off frequency of a transistor to efficiently lower a delay time $t_{pd}$ of the ECL gate, a self-alignment technique for forming shallow emitter and base as well as the optimum design of the transistor and ECL circuit based on the scaling become vital.

The ECL circuit comprises two sorts of transistors, i.e., transistors constituting a current switch circuit and a transistor as an emitter follower circuit.

In such an ECL circuit, in particular, the magnitude of a load resistance is determined by the magnitude of an emitter resistance. Accordingly, it is desirable to minimize the emitter resistance.

In the prior art HBT, however, a band gap difference of a valence band in an AlGaAs/GaAs heterojunction necessary for forming an npn type HBT must be about 150–200 meV from the viewpoint of its current gain. To this end, an Al mole fraction x in $Al_xGa_{1-x}As$ as the material of an emitter layer is set to be usually about 0.3. That is, the emitter layer is made of usually $Al_{0.3}Ga_{0.7}As$ and the HBT using such an emitter layer is small in the mobility of the minority carriers as mentioned earlier, which disadvantageously results in that the emitter resistance is relatively large and thus the switching speed of the HBT cannot be made high.

In this way, the emitter layer of the conventional HBT is made of $Al_xGa_{1-x}As$ having an Al mole fraction of about 0.3. For this reason, the prior art HBT has had such a problem that the carrier mobility is small and the carrier life time is short and thus the performance of the HBT is insufficient.

SUMMARY OF THE INVENTION

In view of the above circumstances, it is an object of the present invention to provide an HBT utilizing an $Al_xGa_{1-x}As/GaAs$ heterojunction which can reduce its emitter resistance and can be operated at a high speed while securing a necessary current gain.

In the present invention, the doping concentration of GaAs forming a base layer is set to be $5 \times 10^{19} cm^{-3}$ or more and a composition ratio x of Al to As in $Al_xGa_{1-x}As$ forming an emitter layer is set to be less than 0.25.

Desirably, the doping concentration of GaAs forming the base layer is set to be $1.2 \times 10^{20} cm^{-3}$.

The present invention is based on the fact that, when a base doping concentration is made very high, a band gap narrowing effect becomes remarkable. That is, the present invention has been made from a viewpoint that, even though it is necessary to make a band gap difference of the valence band to be large in order to maintain the current gain while the doping concentration of the base is raised, it actually becomes unnecessary to make the band gap difference of the valence band to be large if the band gap narrowing occurred due to the high base doping concentration is utilized.

The band gap narrowing based on doping to GaAs is expressed by the following equation (1)(refer to H. C. Casey & F. Stern: J. Appl. Phys. Vol 47, No. 2, 1976, p 631).

$$\Delta Eg = 1.6 \times 10^{-8} \times \rho^{1/3} (eV) \tag{1}$$

where $\rho$ denotes base doping concentration ($cm^{-3}$).

Accordingly, when the carrier concentration is higher than the base doping concentration of $5 \times 10^{19} cm^{-3}$, such band gap narrowing as shown in Table 1 below takes place in the valence band.

TABLE 1

| $\rho$ ($cm^{-3}$) | $\Delta Eg$ (meV) |
|---|---|
| $5 \times 10^{19}$ | 59 |
| $1 \times 10^{20}$ | 74 |
| $1 \times 10^{21}$ | 160 |

Meanwhile, a band gap difference $\Delta Eg$ of a valence band necessary for forming an npn type HBT having a sufficient current gain of $\beta$ is expressed as follows (refer to H. Kromer: Proc. IEEE, 1982, No. 1, p 13).

$$\beta = (Ne/Pb) \cdot (Vnb/Vpe) \cdot \exp(\Delta Eg/kT) \tag{2}$$

where Vnb denotes the drift velocity of carriers in the base layer, Vpe the drift velocity of carriers in the emitter layer, Ne the doping concentration of the emitter layer, Pb the doping concentration of the base layer.

A band gap difference $\Delta Egv$ of a valence band in an AlGaAs/GaAs heterojunction is written as $$\Delta Egv = 0.5x (eV) \tag{3}$$

where x denotes Al mole fraction.

Hence, such band gap differences ΔEgv as shown in Table 2 below are calculated in accordance with the equation (3).

TABLE 2

| x | Δ Egv (meV) |
|---|---|
| 0.15 | 75 |
| 0.2 | 100 |
| 0.25 | 125 |
| 0.3 | 150 |

The reason why the Al mole fraction x is set to be 0.3 and the band gap difference ΔEgv is to be about 150 (meV) in the conventional AlGaAs/GaAs HBT will be appreciated from Table 2.

More in detail, with the above arrangement, since the base doping concentration is as very high as $5 \times 10^{19} \text{cm}^{-3}$ or more, the band gap narrowing effect becomes remarkable and the band gap narrowing exceeds 59 meV.

For this reason, it becomes possible to reduce the band gap difference by an amount corresponding to the above band gap narrowing and to set the Al composition ratio x in the material $Al_xGa_{1-x}As$ of the emitter layer to be less than 0.25, while securing a sufficient current gain.

The theoretical current gain $\beta_{max}$ of an HBT can be obtained by finding the current gain β when the right side of the above equation (2) (which is again given below) becomes maximum.

$$\beta = (N_e/P_b) \cdot (V_{nb}/V_{pe}) \cdot \exp(\Delta E_g/kT) \quad (2)$$

The amount of narrowing the band gap caused by the doping to GaAs is given by the above equation (1)(which is again given below).

$$\Delta E_{gb} = 1.6 \times 10^{-8} \times P_b^{1/3} (eV) \quad (1)$$

Meanwhile, a band gap difference ΔEgv of a valence band in an $Al_xGa_{1-x}As$/GaAs heterojunction is written as $$\Delta E_{gv} = 0.5 x (eV) \quad (3)$$

where x denotes Al mole fraction.

A discontinuity ΔEg in the band gap of the valence band is expressed as follows.

$$\Delta E_g = \Delta E_{gb} + \Delta E_{gv} \quad (4)$$

The mole fraction x of the emitter $Al_xGa_{1-x}As$ necessary for realizing a desired level of current gain of the HBT is written by the following equation (5) from the equations (1), (2), (3) and (4).

$$x = (1/0.5) \times [kT \ln(P_b V_{pe} \beta_{max}/N_e V_{nb}) - 1.6 \times 10^{-8} \times P_b^{1/3}] \quad (5)$$

The remarkable band gap narrowing can be found from this equation when $dx/dP_b = 0$. That is, the narrowing becomes effective when $P_b$ exceeds $1.16 \times 10^{20} \text{cm}^{-3}$.

At the time of calculating the x in accordance with the equation (5), it is assumed in the present embodiment that $\beta_{max} = 50$. This is because $\beta_{max}$ is the theoretical maximum of the current gain and in the actual element, the actual current gain β is smaller than the theoretical value and as low as about 20–30, so that, when it is desired to operate the element as a logic gate, the current gain β must be at least about 20. Further, the $V_{nb}/V_{pe}$, which is considered to be between 0 and 5 taking the mobility of electrons/positive holes into consideration, is set at 5 in the present embodiment.

Specific values of the x are listed in Table 3 below. In the Table, Ne is set to be usually above $5 \times 10^{17} \text{cm}^{-3}$, taking the emitter resistance and so on into account.

TABLE 3

| | $5 \times 10^{17}$ | $1 \times 10^{18}$ | $2 \times 10^{18}$ |
|---|---|---|---|
| $1 \times 10^{20}$ | 0.246 | 0.211 | 0.174 |
| $1.2 \times 10^{20}$ | 0.247 | 0.212 | 0.175 |
| $1.5 \times 10^{20}$ | 0.246 | 0.210 | 0.174 |
| $2 \times 10^{20}$ | 0.244 | 0.208 | 0.172 |
| $5 \times 10^{20}$ | 0.225 | 0.189 | 0.152 |
| $1 \times 10^{21}$ | 0.194 | 0.159 | 0.123 |

As will be seen from the above results, in a zone where the base doping concentration $P_b$ exceeds $1.2 \times 10^{20} \text{cm}^{-3}$, the band gap narrowing effect becomes remarkable and even when Al mole fraction x is set to satisfy x<0.25, a sufficient current gain can be maintained.

In this manner, the band gap difference can be reduced by an amount corresponding to the band gap narrowing effect and the Al composition ratio in the $Al_xGa_{1-x}As$ material of the emitter layer can be set to less than 0.25, while maintaining a sufficient current gain.

For example, an npn type heterojunction bipolar transistor in accordance with the present invention comprises an n⁻ type GaAs layer as a collector layer formed on a semi-insulating substrate; a p⁺ type $Al_xGa_{1-x}As$ (x: 0→a; 0<a<b) layer, an undoped $Al_aGa_{1-a}As$ layer and an $Al_xGa_{1-x}As$ layer (x: a→b) of a graded structure in which the value of x is gradually increased toward an emitter layer so as to slant a conduction band and which form a base layer formed on the n⁻ type GaAs; and an n type $Al_xGa_{1-x}As$ (x=b: b<0.25) layer, an n type $Al_xGa_{1-x}As$ layer (x: b→0) and an n type $In_xGa_{1-x}As$ layer (x: 0→b) which form the emitter layer formed on the base layer.

In this way, actually by inserting such semiconductor layers of the graded structure, a transistor of a laminated layer structure having a good alignment and improved transistor characteristics can be realized.

In accordance with another aspect of the present invention, there is provided a semiconductor device provided with an ECL circuit which comprises a current switch circuit including at least two bipolar transistors and an emitter follower circuit including a bipolar transistor, each of the bipolar transistors of the ECL circuit comprising an emitter layer made of an n type $Al_xGa_{1-x}As$ material which satisfies a relation x <0.25 (where x denoting Al composition ratio to As), a base layer made of a p type $Al_yGa_{1-y}As$ or a p type GaAs material which is smaller in band gap than the $Al_xGa_{1-x}As$ material of the emitter layer and has a doping concentration of $5 \times 10^{19} \text{cm}^{-3}$ or more, and a collector layer made of an n type GaAs material.

DESCRIPTION OF THE PREFERRED EMBODIMENT

An embodiment of the present invention will be explained in detail with reference to the attached drawings.

Figure 1:
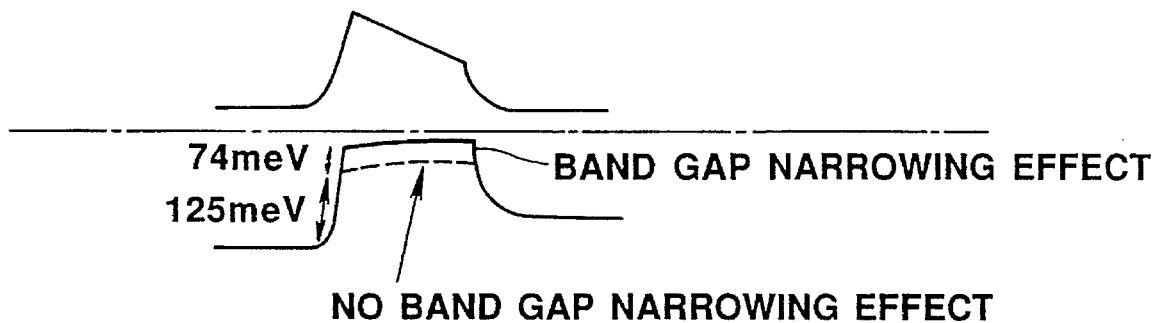
FIG. 1 is a diagram showing an energy band in an emitter/base junction of a heterojunction bipolar transistor in accordance with an embodiment of the present invention.

An npn type AlGaAs/GaAs HBT of the present embodiment is featured in that, as shown by an energy band in its emitter base junction in FIG. 1, with respect to the band gap 125 meV of the original emitter/base junction, the band gap can be made narrow by 74 meV and thus the band gap difference can be made to be 199 meV, by making the impurity concentration of a base layer as high as $1\times10^{20}$ cm$^{-3}$.

Figure 2:
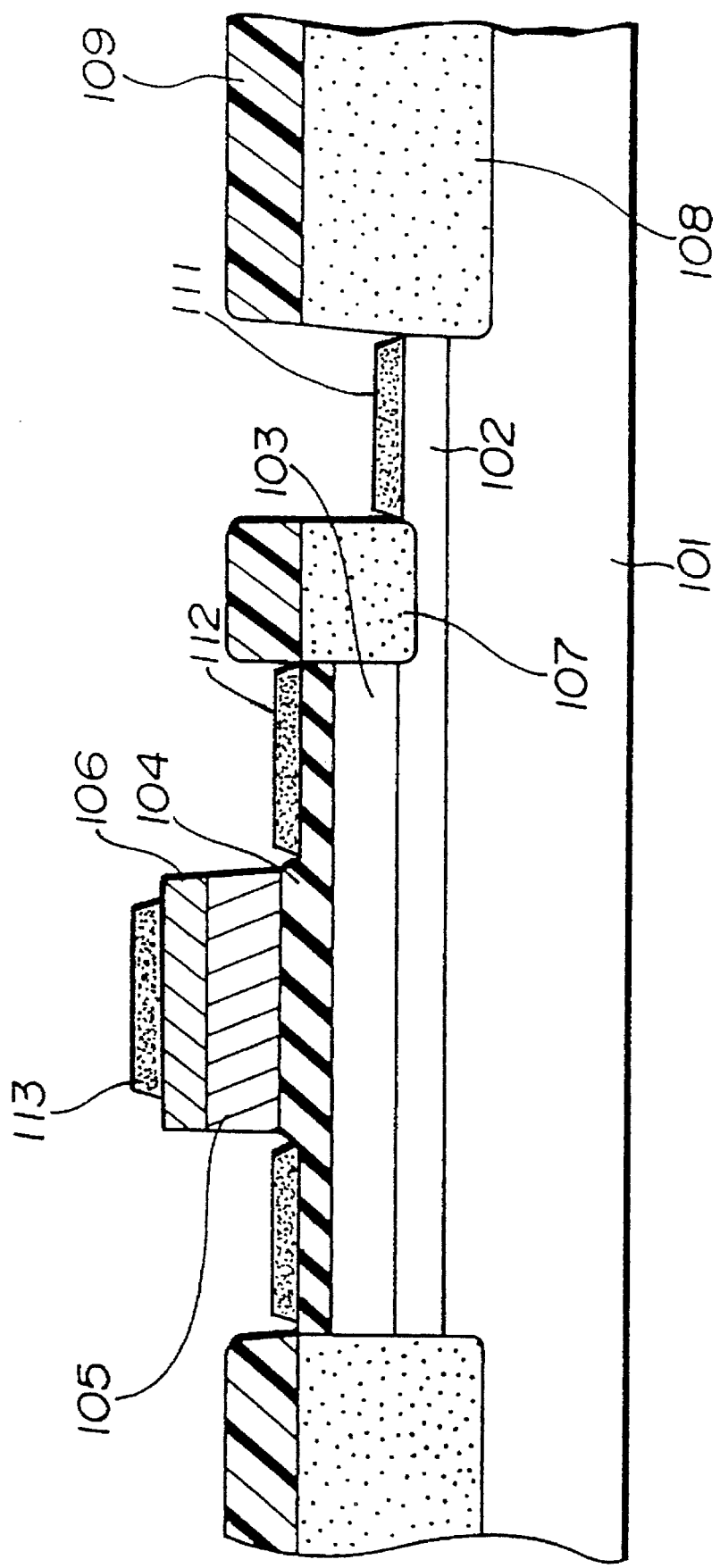
FIG. 2 is a cross-sectional view of the heterojunction bipolar transistor.

The heterojunction bipolar transistor, as shown in FIG. 2, comprises an n$^+$ type GaAs layer having a thickness of 5000 Å as a collector contact layer 102 stacked on a semi-insulating GaAs substrate 101, an n$^-$ type GaAs layer having a thickness of 5000 Å as a collector layer 103 stacked on the collector contact layer 102, a p$^+$ type Al$_x$Ga$_{1-x}$As (x: 0→0.1) layer having a thickness of 900 Å, an undoped Al$_{0.1}$Ga$_{0.9}$As layer having a thickness of 100 Å and an Al$_x$Ga$_{1-x}$As layer (x: 0.1→0.24) having a thickness of 300 Å which form a graded structure in which the value of x is gradually increased toward an emitter layer 105 so as to slant a conduction band and which form a base layer 104 formed on the n$^-$ type GaAs; an n type Al$_x$Ga$_{1-x}$As (x=0.24) layer having a thickness of 1500 Å, an n type Al$_x$Ga$_{1-x}$As layer (x: 0.24→0) having a thickness of 300 Å and an n type In$_x$Ga$_{1-x}$As layer (x: 0→0.5) having a thickness of 500 Å which form the emitter layer 105 formed on the base layer 104; and an n type In$_x$Ga$_{1-x}$As (x=0.5) layer as an emitter cap layer 106 formed on the emitter layer 105. In addition, a collector electrode 111, a base electrode 112 and an emitter electrode 113 are formed through the contact of a silicon oxide film 109 covering the above laminated layers. In the illustrated embodiment, the collector electrode 111 is made of an AuGe/Ni/Au layer, the base electrode 112 is made of a Cr/Au layer, and the emitter electrode 113 is made of a Ti/Pt/Au layer, respectively.

The illustrated structure of FIG. 2 further includes an insulating layer 107 for inter-device isolation which is formed by boron ion implantation, and an insulating layer 108 for inter-device isolation which is formed by proton implantation.

Explanation will next be made how to fabricate the hereto junction bipolar transistor.

It is necessary first of all to epitaxially grow these semiconductor layers sequentially on the GaAs substrate in a lattice-aligned relation to the layers. In this connection, as the epitaxial growth technique, a molecular-beam epitaxy technique (MBE technique), a gas source molecular-beam epitaxy technique (GSMBE technique), or a low-pressure metal organic CVD technique (LPMOCVD technique) is used.

The fabrication conditions of the transistor when the molecular-beam epitaxy technique is employed will be detailed sequentially in connection with its fabrication steps. First, an n$^+$ type GaAs layer of 5000 Å thickness as the collector contact layer 102 having an Si impurity concentration of $3\times10^{18}$ cm$^{-3}$ and then an n$^-$ type GaAs layer of 5000 Å as the collector layer 103 having an impurity concentration of $8\times10^{16}$ cm$^{-3}$ are sequentially epitaxially grown on the semi-insulating GaAs substrate 101.

Then epitaxially grown on the n$^-$ type GaAs layer is a p$^+$ type Al$_x$Ga$_{1-x}$As (x: 0→0.1) of 900 Å thickness having a Be impurity concentration of $1\times10^{20}$ cm$^{-3}$. In this case, the value of x is set so as to be increased from 0 to 0.1 upward from its bottom, whereby an electric field can be established to accelerate electrons within the base from its emitter side to the collector side. Next, sequentially grown on the p$^+$ type Al$_x$Ga$_{1-x}$As (x: 0→0.1) layer are an undoped Al$_x$Ga$_{1-x}$As (x=0.1) of 100 Å and an n type Al$_x$Ga$_{1-x}$As (x: 0.1→0.24) of 300 Å having an Si impurity concentration of $5\times10^{17}$ cm$^{-3}$. In the layers, the value of x is set so as to be increased from 0.1 to 0.24 upward from its bottom, whereby the conduction band in the base/emitter junction can be made smooth.

Epitaxially grown on the n type Al$_x$Ga$_{1-x}$As (x: 0.1→0.24) layer are an n type Al$_x$Ga$_{1-x}$As (x=0.24) layer of 1500 Å having an Si impurity concentration of $5\times10^{17}$ cm$^{-3}$ and then an n type Al$_x$Ga$_{1-x}$As (x: 0.24→0) layer of 300 Å having an impurity concentration of $1\times10^{18}$ cm$^{-3}$. In this case, the value of x is set so as to be decreased from 0.24 to 0 upward from its bottom.

Further on the n type Al$_x$Ga$_{1-x}$As (x: 0.24→0) layer, an n type In$_x$Ga$_{1-x}$As (x: 0→0.5) layer is epitaxially grown so that the conduction band in a gap between the emitter and emitter cap can be made smooth together with the n type Al$_x$Ga$_{1-x}$As (x: 0.24→0) layer.

Finally, an n type In$_x$Ga$_{1-x}$As (x=0.5) layer of 500 Å having an Si impurity concentration of $2\times10^{19}$ cm$^{-3}$ is epitaxially grown thereon as the emitter cap layer 106.

Figure 3:
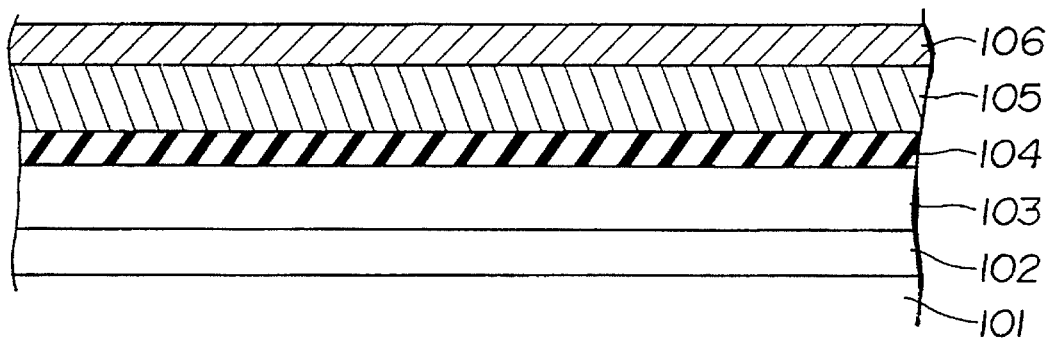
FIG. 3 shows epitaxial wafers forming the heterojunction bipolar transistor.

In this manner, such an epitaxial wafer as shown in FIG. 3 is obtained.

Subsequently, the epitaxial wafer thus formed is used so that the substrate 101 is subjected first to an H$^+$ ion implantation to form the insulating layer 108 for inter-device isolation therein and to a B$^+$ ion implantation to form the insulating layer 107 for inter-device isolation reaching the n$^+$ type GaAs layer 102 inside the transistor.

The semiconductor layer wafer is then subjected to an etching process with use of a predetermined mask to such a depth as reaching the base layer 104 to expose the base, on which a Cr/Au film is deposited as the base electrode 112.

After this, the semiconductor layer wafer is subjected to a plasma CVD process to form a silicon oxide film 109 on the entire top surface of the wafer. The wafer is subjected to an etching process to such a depth as reaching the n$^+$ type GaAs layer 102 of the collector contact layer 102 from the top surface of the wafer, on which a thin AuGe/Ni/Au layer is formed to provide the collector electrode 111.

Next, the wafer is subjected to a window-making process to the emitter, a beer-hall opening process to the collector and base electrodes 111 and 112, and then subjected to an internal wiring (not shown) to the emitter electrode 113 as a Ti/Pt/Au layer.

The HBT thus formed (having dimensions of 2 μm×5 μm) had an emitter resistance of 3Ω and a current gain of 80.

An ECL circuit using this HBT, when a load resistance was set to be 100 Ω to form a ring oscillator, has a delay time τ as very small as 8 psec.

In the present embodiment, since the value of x in the material Al$_x$Ga$_{1-x}$As of the base layer is gradually varied from 0.1 to 0 from its emitter side, that is, the base layer has a graded structure, the Vnb in the equation (2) can be set large and therefore the requirements of the heterojunction for the band gap difference can be set loosely. However, in the present embodiment, the band gap difference is strictly set to be 150 meV, taking the band gap narrowing effect into consideration.

The impurity concentration and thickness of these semiconductor layers may be suitably modified as necessary.

Further, it goes without saying that the present invention can be applied also to a reverse transistor. In addition, the present invention may be carried out in various ways within the spirit and scope of the inventions as defined in the appended claims.

What is claimed is:

1. An npn type heterojunction bipolar transistor, comprising:
   a semi-insulating GaAs substrate;
   a collector contact layer, formed on said semi-insulating GaAs substrate, comprising an n$^+$ type GaAs sublayer;
   a collector layer formed on said n$^+$ type GaAs sublayer, comprising an n$^-$ type GaAs sublayer;
   a base layer, formed on said collector layer, comprising a p$^+$ type Al$_x$Ga$_{1-x}$As sublayer (x: 0→0.1) and an undoped Al$_{0.1}$Ga$_{0.9}$As sublayer;
   an Al$_x$Ga$_{1-x}$As sublayer (x: 0.1→0.24) formed on said base layer, and having a graded structure in which the value of x is gradually increased in a direction away from said collector layer so as to provide a slanted conduction band;
   an emitter layer, formed on said base layer, comprising an n type Al$_x$Ga$_{1-x}$As sublayer (x=0.24), an n type Al$_x$Ga$_{1-x}$As sublayer (x: 0.24→0), and an n type In$_x$Ga$_{1-x}$As sublayer (x: 0→0.5); and
   an emitter cap layer, formed on said emitter layer, comprising an n type In$_x$Ga$_{1-x}$As sublayer (x=0.5).

2. The npn type heterojunction bipolar transistor as set forth in claim 1, further comprising:
   an insulating film covering a surface of the transistor;
   a collector electrode comprising an AuGe/Ni/Au layer formed through contacts formed on said insulating film;
   a base electrode comprising a Cr/Au layer formed through contacts formed on said insulating film; and
   an emitter electrode comprising a Ti/Pt/Au layer formed through contacts formed on said insulating film.

3. The npn type heterojunction bipolar transistor as set forth in claim 1, wherein said p$^+$ type Al$_x$Ga$_{1-x}$As sublayer of said base layer has a doping concentration of $5\times10^{19}$cm$^{-3}$ or more.

4. An npn type heterojunction bipolar transistor as set forth in claim 1, wherein said p$^+$ type Al$_x$Ga$_{1-x}$As sublayer of said base layer has a doping concentration of $1.2\times10^{20}$cm$^{-3}$ or more.

5. An npn type heterojunction bipolar transistor, comprising:
   a semi-insulating substrate;
   a collector layer, formed on said semi-insulating substrate, comprising an n$^-$ type GaAs sublayer;
   a base layer formed on said collector layer, comprising a p$^+$ type Al$_x$Ga$_{1-x}$As sublayer (x: 0→a, a<b) and an undoped Al$_a$Ga$_{1-a}$As sublayer;
   an Al$_x$Ga$_{1-x}$As sublayer (x: a→b) formed on said base layer, and having a graded structure in which the value of x is gradually increased in a direction away from said collector layer so as to provide a slanted conduction band;
   an emitter layer, formed on said base layer, comprising an n type Al$_x$Ga$_{1-x}$As sublayer (x=b: b<0.25);
   an n type Al$_x$Ga$_{1-x}$As sublayer (x: b→0) formed on said emitter layer; and
   an n type In$_x$Ga$_{1-x}$As sublayer (x: 0→c, c>0) formed on said n type Al$_x$Ga$_{1-x}$As sublayer (x: b→0).

6. The npn type heterojunction bipolar transistor as set forth in claim 5, wherein said p$^+$ type Al$_x$Ga$_{1-x}$As sublayer of said base layer has a doping concentration of $5\times10^{19}$cm$^{-3}$ or more.

7. The npn type heterojunction bipolar transistor as set forth in claim 6, wherein c=0.5.

8. An npn type heterojunction bipolar transistor, comprising:
   a semi-insulating substrate;
   a collector layer, formed on said semi-insulating substrate, comprising an n$^-$ type GaAs sublayer;
   a base layer formed on said collector layer, comprising a p$^+$ type Al$_x$Ga$_{1-x}$As sublayer (0<x<a, a<b) and an undoped Al$_a$Ga$_{1-a}$As sublayer;
   an Al$_x$Ga$_{1-x}$As sublayer (x: a→b) formed on said base layer, and having a graded structure in which the value of x is gradually increased in a direction away from said collector layer so as to provide a slanted conduction band; and
   an emitter layer, formed on said base layer, comprising an n type Al$_x$Ga$_{1-x}$As sublayer (x=b: b<0.25), an n type Al$_x$Ga$_{1-x}$As sublayer (x: b→0), and an n type In$_x$Ga$_{1-x}$As sublayer (x: 0→c, where c>0).

9. The npn type heterojunction bipolar transistor as set forth in claim 5, wherein said p$^+$ type Al$_x$Ga$_{1-x}$As sublayer of said base layer has a doping concentration of $1.2\times10^{20}$cm$^{-3}$ or more.

* * * * *